United States Patent
MacLeod

[11] 4,045,714
[45] Aug. 30, 1977

[54] REMOTE SWITCH CONTROL AND STATUS INDICATOR SYSTEM

[76] Inventor: Donald A. MacLeod, 6815 Ridgewood Drive, Oakland, Calif. 94611

[21] Appl. No.: 584,569

[22] Filed: Apr. 8, 1975

Related U.S. Application Data

[63] Continuation of Ser. No. 493,343, July 31, 1974, abandoned, which is a continuation of Ser. No. 294,822, Oct. 7, 1972, abandoned.

[51] Int. Cl.$^2$ .......................................... H01H 47/32
[52] U.S. Cl. .................................... 361/156; 340/409
[58] Field of Search .......... 317/29, 151, 154, 148.5 B; 324/52, 127; 340/151, 152, 216, 310, 409

[56] References Cited

U.S. PATENT DOCUMENTS

| | | | |
|---|---|---|---|
| 2,709,800 | 5/1955 | Temple et al. | 324/127 X |
| 3,181,032 | 4/1965 | Myers | 317/151 X |
| 3,414,773 | 12/1968 | Knox | 317/29 R |
| 3,425,050 | 1/1969 | Tellerman et al. | 317/151 X |
| 3,641,539 | 2/1972 | Lesher | 340/409 X |
| 3,702,474 | 11/1972 | Fink et al. | 340/409 |

Primary Examiner—Harry E. Moose, Jr.
Attorney, Agent, or Firm—George B. White

[57] ABSTRACT

A plurality of control stations spaced along conductor lines; a normally closed disconnect switch at each station for connecting or disconnecting said conductor lines; a fault detector at each station; a status indicator at each station to indicate the status of said fault detector and of said disconnect switch; an electrically actuated indicator device remote from said stations; remote power source; and remote control selector means for selectively connecting the status indicator of a selected station to said indicator device for indicating the status of said fault detector and of said disconnect switch; said selector means being also capable of connecting said remote power source to the disconnect switch a selected station for opening or closing said disconnect switch.

9 Claims, 4 Drawing Figures

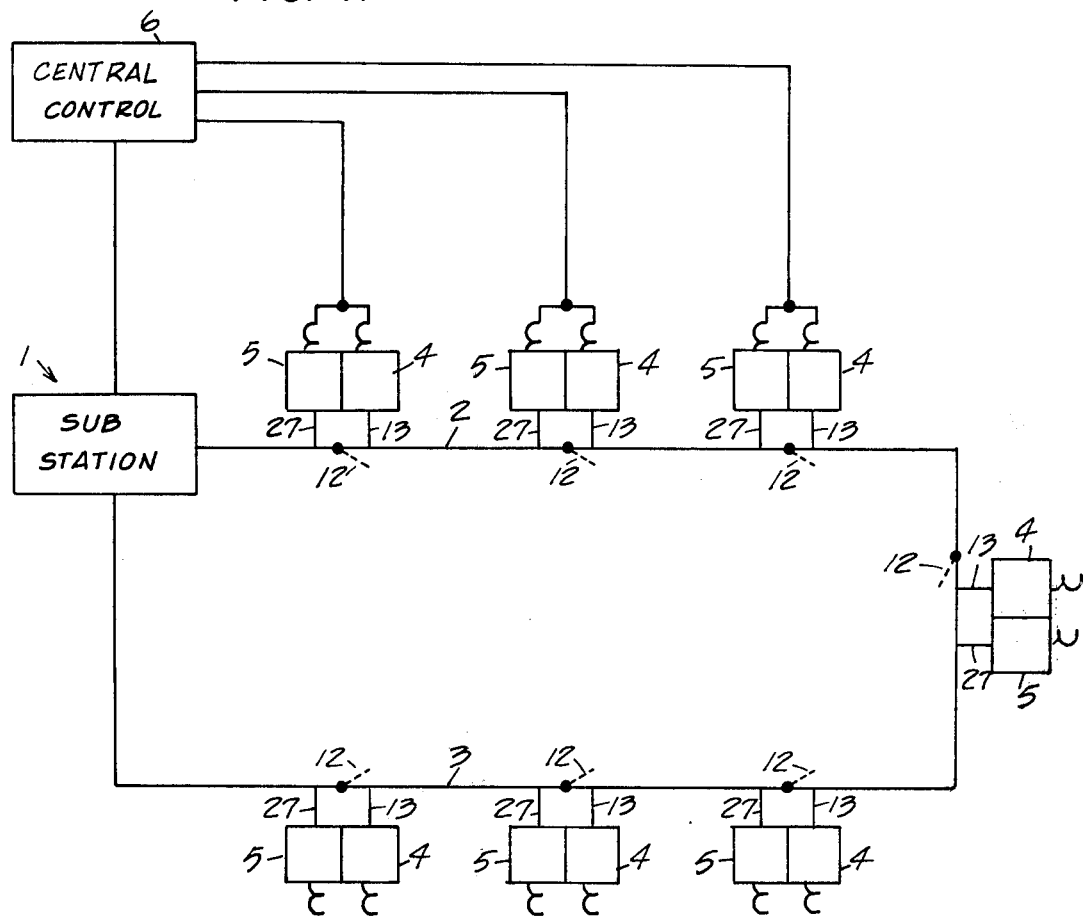

REMOTE SWITCH CONTROL AND STATUS INDICATOR SYSTEM

This is a continuation of application Ser. No. 493,343 filed July 31, 1974, now abandoned, which is a continuation of Ser. No. 294,822, filed Oct. 7, 1972, now abandoned.

BACKGROUND OF THE INVENTION

The control and monitoring of distribution line switches and fault detectors presented for a long time considerable problems. In the prior art the distribution of power from a substation usually was accomplished by a circuit breaker in the substation for each line radiating from the substation. It is also usual to provide disconnect means at intervals along the entire length of said line. Such disconnect means may be used to break up the line into sections in order to isolate fault conditions.

It is the primary object of this invention to provide means for the remote detection of faults and also remote control of said disconnect means and particularly it is an object to provide means whereby an operator at a remote point can determine the status of respective disconnect means along the power line, the circuit being such that it is capable to report to said operator its status.

It is another object of the invention to utilize overcurrent detection means not connected to the power line conductors but responsive to an overcurrent condition such as would be produced by a short circuit or ground fault on said line beyond the location of said overcurrent detector, which is so actuated that it remains in a certain status until restored to its initial status by direction of or under control of said remote operator.

BRIEF DESCRIPTION OF THE DRAWINGS

FIG. 4 is a schematic view illustrating the relation of the substation to the respective lines and line switches.

DETAILED DESCRIPTION

Figure 1:
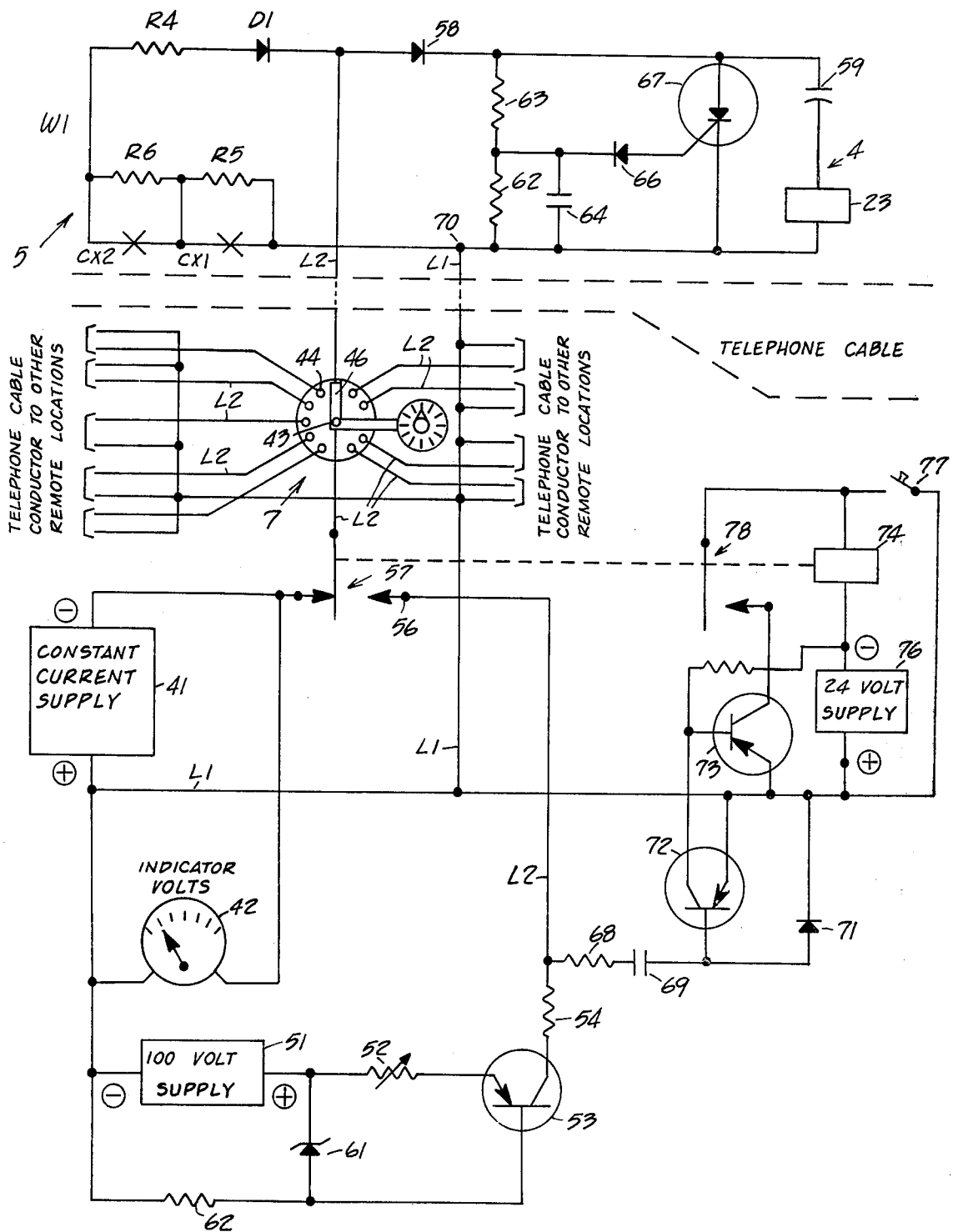
FIG. 1 is a wiring diagram of the control and indicator circuit.

As shown in FIG. 4, power is distributed through a substation 1 by line 2 and a parallel feed line 3. Disconnect means 4 are provided at intervals along the lines 2 and 3. Detector means 5 are provided at each disconnect means 4. The substations 1 are connected to a central control 6, in which latter are provided the usual indicators to indicate to the operator whenever the automatic circuit breaker (not shown) at the substation is opened by reason of a fault or overload on the respective line. Usual controls (not shown) are manipulated by the opertor for closing the substation circuit breaker after the fault is repaired.

In order to operate the proper disconnect means so as to disconnect and isolate the fault area, the operator is provided with selector means 7 so as to find the fault area, and then to actuate the respective disconnect means at the respective limits of said area.

In the herein embodiment the various devices are shown in simple illustrative or diagrammatic forms, but it is to be understood that more sophisticated devices are available for use in the respective circuits.

The Disconnect Means

Figure 2:
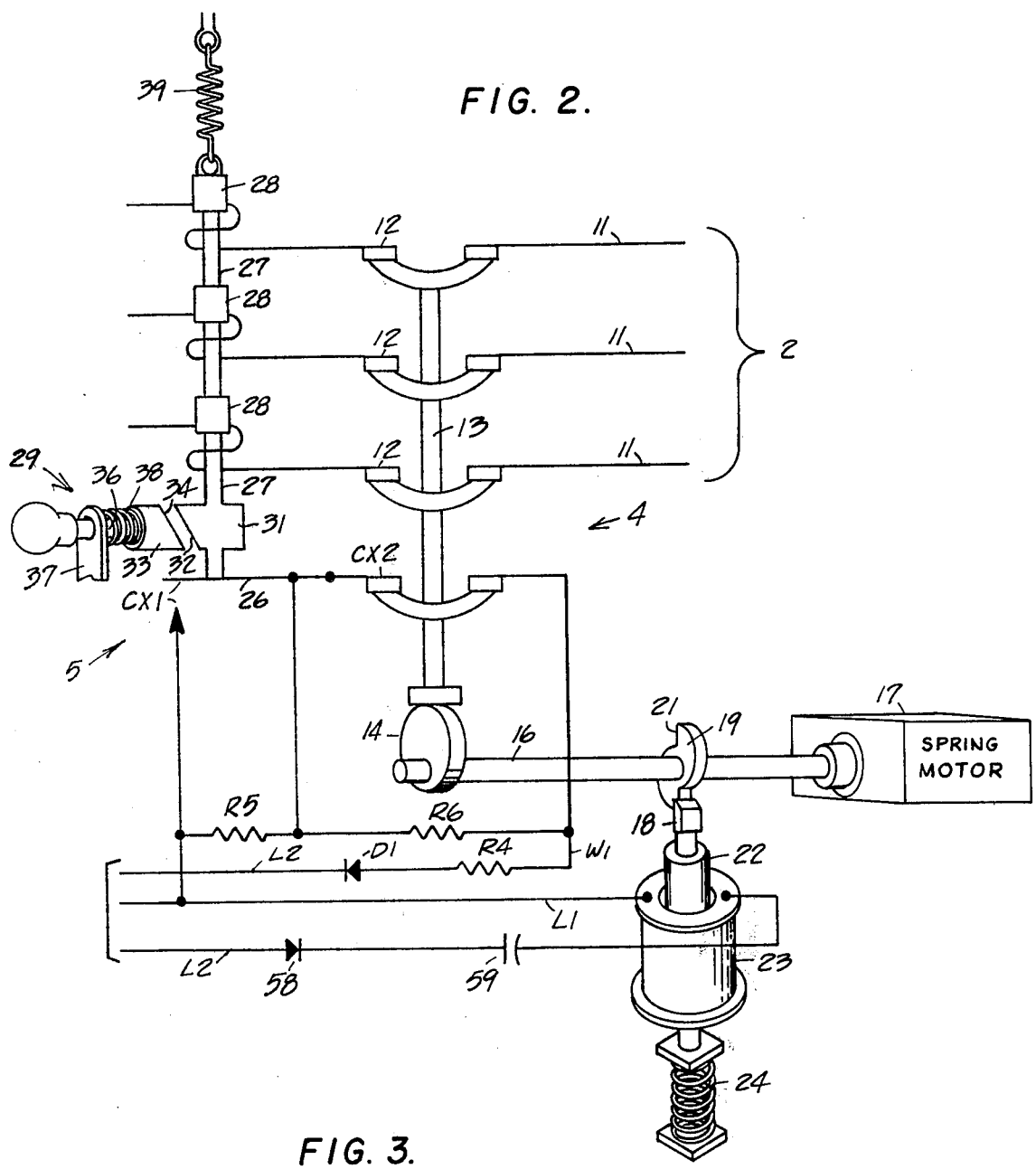
FIG. 2 is a detail diagram of the disconnect switch means.

FIG. 2 shows a three phase power line 2, in the lines 11 of which are interconnected line conductor switch contacts 12 of a disconnect switch. A normally closed status indicator switch CX2 is connected to the switch contacts 12 so as to be opened and closed together with the disconnect switch. In this illustrative embodiment a stem 13 moves the contacts 12 and the switch CX2 simultaneously. The disconnect means 4 includes said contacts 12 and said stem 13, and in this illustration, an eccentric cam 14 on a shaft 16 whereby the cam 14 is turned for opening and closing the switch contacts 12 and the status indicator switch CX2. The shaft 16 is turned by a suitable preloaded spring motor 17. Turning of the shaft 16 is blocked by a stop 18 engaging a double limit cam 19 on the shaft 16. Namely the double limit cam 19 has a pair of abutment faces 21, 180° apart, facing in clockwise direction to abut against the stop 18 beneath the shaft 16. The stop 18 is on the core 22 of an electromagnet 23 so that when the electromagnet 23 is momentarily energized it pulls the stop 18 momentarily out of the way to permit the limit cam 19 and shaft 16 a half a turn respectively for opening or closing the switch contacts 12 and the status indicator switch CX2. A suitable coil spring 24 snaps the stop 18 back into blocking position.

The Status Detector Means

In FIG. 2 there is shown also a diagrammatic illustration of a normally open status detecting switch CX1 the contact arm 26 of which is normally held in circuit opening position by the core stem 27 of electromagnets 28 which latter are in series with the respective power lines 11 and are normally energized. A suitable latch 29 also releasably holds the core stem 27 in circuit opening position. In the herein simplified form the core stem 27 has a collar 31 thereon with a downwardly inclined slanting face 32. The latch has a bolt 33 the end of which has a slanting face 34 matching the slanting face 32 of the collar 31. The bolt stem 36 is guided in a suitably fixed bracket 37, and a coil spring 38 between the bracket 37 and the shoulder of the bolt 33 normally pushes the bolt 33 into engagement with the inclined face 32. A coil spring 39 pulls the core stem 27 into an initial position wherein the status indicator or detector switch CX1 is open. The catch bolt 33 then holds the core stem 27 in circuit opening position. Whenever an overcurrent condition occurs in the power lines 11, due to a short circuit or ground fault, the electromagnets 28 shift the core stem 27 so as to push the latch bolt 33 out of the way and close the status indicating or detector switch CX1. The latch bolt 33 then snaps over the collar 31 and holds the core stem 27 in circuit closing position. After the fault is repaired the latch 29 is pulled out to permit the stem spring 39 to pull the core stem 27 back to its initial circuit opening position.

The Status Indicator Circuit

The detector circuit includes a line L1 connected to the positive terminal of a constant current supply 41. This line L1 returns through a line W1 to a return line L2 which latter is connectible to the negative terminal of said constant current supply 41. The detector switch CX1 and the status indicator switch CX2 are connected in series with one another and in series in line W1. A resistor R4 is connected in series between a diode D1 and the line W1. Another resistor R5 is connected in line W1 in parallel with the detector switch CX1, so that when the latter is closed the resistor R5 is short-circuited. Another resistor R6 is connected in series with resistor R5 and also connected in parallel with the status indicator switch CX2 in line W1 so that when the status indicator switch CX2 is closed it short-circuits the resistor R6, as illustrated on the left-hand side viewing FIG. 1.

A suitable status indicator instrument or device, such as a voltmeter 42 is connected in parallel in this indicator circuit. The resistors R4, R5 and R6 are so proportioned that whenever resistor R5 or R6 is short-circuited respectively by closing of the detector switch CX1 or the status indicator switch CX2, the resultant degrees of voltage on the voltmeter indicate the status of the respective switches, namely whether the respective switches are opened or closed.

For instance, if resistors R4 and R6 produce the same voltage drop, namely ten volts each, and if the voltage drop by resistor R5 is equal to that of the sum of the voltage drops of resistors R4 and R6, namely 20 volts, then under normal working conditions R6 is short-circuited by the closed status indicator switch CX2, and the voltmeter 42 would indicate a voltage of 20 volts. But when over-current causes the closing of the detector switch CX1 and thus short-circuits resistor R5, the voltmeter reads only 10 volts. When subsequently the status indicator switch CX2 is opened by the operation of the disconnect device 4, together with the opening of the power switch contacts 12, then the voltmeter 42 would give a reading of 30 volts. Should both the detector switch CX1 and status indicator switch CX2 be open at the same time, then the reading in the voltmeter would indicate 40 volts. Thus the reading on the voltmeter would indicate the status of the switches CX1 and CX2 which, in turn, would indicate the condition of the status of the power line and its switch at the particular location. The voltmeter 42 is shown in the circuit for the sake of simplicity of illustration because in actual practice said status indicating voltage could be quantized or converted from an analog value to a digital or other forms for transmission to an operator at different locations. In the above circuit the diode D1 functions as a gate to assure flow in said status indicating circuit in one direction.

The Selector Means

Selector means are operable to selectively connect the constant current supply 41 and the indicator voltmeter 42 to a selected status detector means 5 of the status indicator circuit. In the simplified illustrative form herein a central contact 43 is connected to the common feed line L2, of the indicator circuit. A plurality of separate contacts 44 are connected by respective individual lines to the circuits of the respective detector means 5. A contact arm 46 is connected at one end to the common current supply line contact 43 and to the current supply 41. The arm 46 is turned to selectively contact the individual L2 line contacts 44 thereby to close the circuit between the current supply and the selected L2 lines for detecting the status of the respective switches CX1 and CX2. The L1 lines are common to all stations, for instance, as grounds.

The Disconnect Operating Circuit

The circuit to operate the disconnect means 4 includes a higher voltage constant current supply, for instance, an 100 volt current supply 51. The positive side of the power supply 51 is connected through a variable resistor 52 and then through a semi-conductor such as a PNP transistor 53 and a resistor 54 to a terminal 56 which is selectively connectible to the common supply line L2.

A switch 57 normally is yieldably held in series in line L2 of the detector circuit as shown in FIG. 1. When the switch 57 is disconnected from the portion of line L2 which leads to current supply 41, and is connected to the terminal 56 then the 100 volt supply is thereby connected to the L2 terminal 43 and through the arm 46 to the L2 line closing the circuit from the 100 volt supply 51 through a diode 58, a capacitor 59, to a terminal of the trigger electromagnet 23 and then to line L1 and back to the minus side of the 100 volt power supply 51. The variable resistor 52 and the transistor 53 form part of a usual constant current regulator for the 100 volt supply 51, together with diode 61 and a suitable resistor 62 all connected to the minus side of the 100 volt supply. This constant current regulator thus shown in a simplified form limits the current to voltage compatible with the cable or line facilities which is considerably below the operating current requirement of the trigger electromagnet 23. However, such regulated current produces a charge in the capacitor 59.

Another path for such regulated current from the 100 volt supply 51 is from the terminal 70 of line L1 through resistors 62 and 63 and through the diode 58 to the terminal of line L2. Resistors 62 and 63 form a voltage divider with the voltage across resistor 62 being the same as that across a capacitor 64. The capacitor voltage from capacitor 64 is applied to an auxiliary circuit consisting of a diode 66 and the control junction of a thyristor 67. The diode 66 is of the type generally known as a trigger or 4-layer diode which has a normal state of non-conduction. When the voltage of said capacitor 64, as applied across diode 66 increases to the trigger point of said diode 66, said diode 66 assumes a state of conduction. With said diode 66 in conduction most of the charge in capacitor 64 is applied to the control junction of the thyristor 67 causing it to provide a path for the discharge of energy stored in capacitor 59 into trip magnet 23 thereby to operate the disconnect means 4 in the manner heretofore described. The resistors 62 and 63 are so proportioned as to cause the voltage across capacitor 64 to reach the trigger voltage of diode 66 only when the voltage across capacitor 59 indicates that it has stored enough energy to operate the trigger magnet 23.

Still another path for said higher charging current of the 100 volt supply 51 is a holding relay circuit, from the line L2 through resistor 68, capacitor 69 and diode 71 back to line L1 and to the minus side of the 100 volt supply 51. This produces a charge in capacitor 69 proportional to the charge in capacitor 59. When the thyristor 67 goes into conduction as heretofore described, it is effectively a short circuit across the line wires L1 and L2 and causes the capacitor 69 to discharge into a transistor 72 turning it on so that the latter short circuits the base of another transistor 73 allowing the latter to turn off. The switch 57 is adapted to be switched over from the terminal of the constant current supply 41 to the terminal of the 100 volt current supply 51 by a relay 74 which is in the circuit of a 24 volt current supply 76 controlled by a key 77. When the key 77 is closed momentarily by an operator the circuit of the relay 74 is closed. Relay 74 is connected to the electro magnetically operated switch 57 so as to turn the switch 57 away from the terminal of the constant current supply 41 to the terminal 56 of the 100 volt current supply 51 as heretofore described. Another electro magnetically controlled switch 78 is closed by the relay 74 so as to close the relay circuit through the transistor 73 to the positive terminal of the 24 volt supply 76 thereby to hold the relay 74 energized and to hold the switch 57 closed into the circuit of the 100 volt current supply 51. When the base of transistor 73 is short circuited and it is turned off, and when the thyristor 67 goes into conduction as heretofore described, it breaks the circuit of the relay 74 which is thus deenergized so that the switches 57 and 78 are returned to their initial position, namely the switch 57 is returned to the initial indicating and detecting status.

Alternate Indicator Circuit

Figure 3:
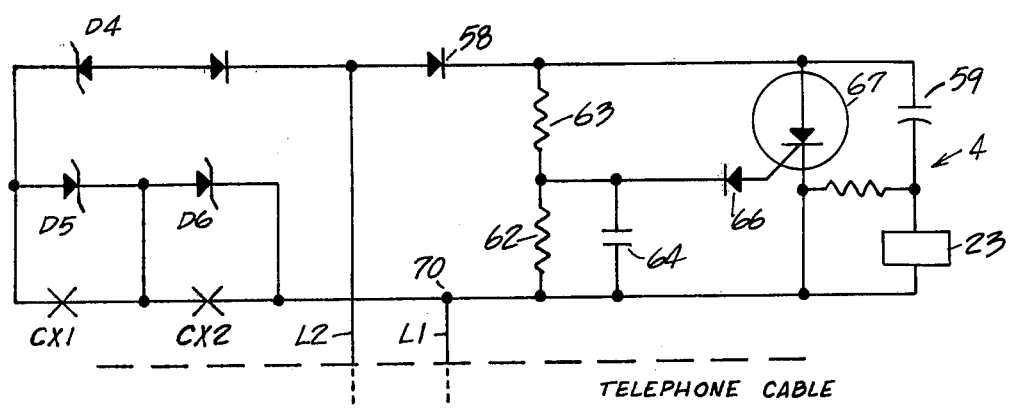
FIG. 3 is a modified form of the control circuit.

In FIG. 3 is shown an alternate indicator circuit which differs from the circuit heretofore described in that in place of resistors R4, R5 and R6 there are substituted diodes D4, D5 and D6 of the type described as Zener diodes and so connected into the circuit as to allow said current to produce their Zener or reverse voltage across their terminals. Thus when diode D6 is short circuited it decreases the total voltage measure on said indicator circuit voltmeter 42. The fault detector switch CX1 when closed short circuits diode D5 and thereby decreases the measured voltage by the Zener voltage of said diode D5. Diodes D4 and D5 are chosen to have the same Zener voltage, and diode D6 is chosen to have a Zener voltage equal to the sum of Zener voltages of diodes D4 and D5 to enable said indicator, such as the voltmeter 42, to effectively indicate which of the four possible contact states exist at the moment of selective circuit closing.

Operation

In operation when at the substation there is a conventional indication to the operator that by reason of a fault or overload the usual automatic circuit breaker for the entire line is open, the operator turns the contact arm 46 to the respective selected contacts 44 and observes the indicator such as the voltmeter 42 for the location of the fault. The fault or overload on the power lines 11, prior to the automatic disconnection of the current therethrough, increases energization of electro magnets 28 so as to close the fault indicator switch CX1. The indication at contacts 44 up to the point of fault will give a reading, in this illustration, 10 volts, because the overload closes all fault indicator switches CX1 between the location of the fault and the substation. When the operator reaches a contact 44 where the voltage reading on the indicator voltmeter 42 is 20 volts, that is an indication of the location of the point of fault because it indicates that at that point the fault detector switch CX1 is open. At that point the operator closes the relay activator key 77 momentarily thereby to energize the relay 74 for closing the switch 57 into the circuit of the 100 volt current supply 51 as heretofore described, and thereby to energize the trigger electromagnet 23 momentarily in the manner heretofore described, to allow the turning of the spring motor 17 and the cam 14 for opening the switch contacts 12 in the power lines 11 and also opening the disconnect indicator switch CX2. The relay holding switch 78 is also closed by the relay 74 and closes the circuit to the 24 volt current supply 76, thereby to keep switch 57 closed to the 100 volt current supply 51 until the capacitor 59 is discharged and the trigger magnet 23 is actuated, whereupon the base of transistor 73 is short circuited and turned off so as to deenergize the relay 74 and permit the spring action of switches 57 and 78 to return to the initial position as heretofore described. After the disconnect means at this last location have been actuated so as to open the disconnect switch, the disconnect indicator switch CX2 is also opened, but the fault indicator switch CX1 at this last location is still open, therefore the reading on the voltmeter 42, in the present illustration, is 40 volts. Then the operator turns the contact arm 46 back to the next to the last contact 44 which still indicates fault (10 volts) and again momentarily closes the key 77 to operate the disconnect means so as to disconnect the lines 11 from the substation at this next to the last indicator station. In this manner the faulted section of lines 11 is isolated. The operator then locates on the usual chart, diagram, or other available means, the connection from said by-pass line 3 nearest beyond said faulted section. The disconnect device at each by-pass line connection to the lines 11 is normally open and is provided with the same operating and detector means heretofore described. The operator connects to a contact 44 to the by-pass connecting station and closes the key 77 to actuate the disconnect device, as heretofore described, for closing the circuit between the by-pass line 3 and the power line 2 beyond the faulted section. Then the operator notifies in the usual manner those in charge of repair the location of the faulted section. After the repair is performed the latch 33 is pulled out of the way either manually as herein shown or by suitable other means, so as to allow the spring 39 to pull the stem 27 back into its initial position thereby to open the fault detector switch CX1. The operator by again closing the key 77 actuates the trigger electro magnet 23 momentarily for reclosing the respective switch contacts 12 into the power lines 11 at both ends of the faulted section, and performs the same operation at the by-pass line connecting station for opening the switch at said connecting station, thereby to resume normal current flow in the power line 2.

In practice the parts of the device shown in FIG. 2 are provided at the respective spaced locations and the respective indicator switches CX1 and CX2 are also located at the respective spaced locations, and lines L1 and L2 respectively are connected to the remote control and operating circuits by suitable wire such as telephone cable or lines of similar capacity. The part of the circuit indicated at the top of FIG. 1, including resistors R4, R5 and R6 and diode D1 in the detector circuit, and resistors 62 and 63, capacitor 64, diode 58, diode 66 and thyristor 67 are altogether combined in a comparatively small closed unit easily installed at the spaced locations with terminals for connection to the line L1 and L2 and also terminals for connection to capacitor 59 and to the respective terminals of the trigger electromagnet 23 which latter form part of the disconnect means 4. The detecting and operating circuits as heretofore described are in the remote control stations or units for detection and actuation at selected locations substantially in the manner as heretofore described either by manipulation, or by suitable available computer or similar devices.

I claim:

1. In a remote switch control and status indicator system for conductor lines for power distribution circuits,
   a plurality of detector circuits,
   a plurality of disconnect circuits, an indicator circuit,
a power supply circuit for the disconnect circuits,
selector means to connect the indicator circuit to a selected detector circuit,
means to connect at will said power supply circuit to a disconnect circuit selected by said selector means,
a fault detector switch in each detector circuit, means actuated by overcurrent in said conductor circuit to operate said fault detect switch to indicate a fault,
a disconnect switch in each disconnect circuit for breaking the circuit of said conductor lines, said disconnect switch normally closing said circuit of each conductor lines,
disconnect switch operating means related to said disconnect circuit and actuated by said power supply to operate each disconnect switch for alternately breaking and closing the circuit of said conductor lines whenever said power supply is connected to said disconnect circuit,
a status indicator switch in each detector circuit being responsive to the status of said disconnect switch,
a fault detector switch and a disconnect switch being provided at each of spaced stations along said conductor lines whereby through said selector means the fault in said conductor lines can be selectively indicated and whereby the circuit of said conductor lines can be opened or closed selectively by connecting said power circuit to the selected disconnect switch operating means.
said selector means being remote from said stations,
means to connect said circuits to said selector means for selective operation.
said fault detector switch and said status indicator switch being connected in said detector circuit and through said selector means to said indicator circuit so as to indicate the fault and the status of said switches in the selected detector circuit.

2. The system specified in claim 1, and each detector means including
means in each detector circuit to modify the indicator circuit according to the condition of said fault detector switch and of said status indicator switch for said indication.

3. The system specified in claim 2, and
said circuit modifying means including circuit elements shunted across the respective fault detector switch and the respective status indicator switch.

4. The system specified in claim 2, and
overcurrent actuated means related to the current in said conductor lines to operate each fault detector switch along a section of said line subjected to overcurrent, whereby a faulted section of said lines can be isolated by opening the disconnect switches nearest to the faulted portion of said lines.

5. The system specified in claim 1, and
said means to connect said power supply to a selected disconnect circuit including
a normally open switch operable to close the power supply circuit through said selector means to a selected disconnect circuit,
a switch holding circuit for closing said normally open switch and holding it in closed position,
means to inactivate said switch holding circuit after each operation of said disconnect switch,
and means to return said normally open switch to its open attitude.

6. The system specified in claim 5, and
said indicator circuit including a constant current supply, said power supply circuit including a current supply of higher voltage than the voltages of said constant current supply and of said switch holding circuit.

7. The system specified in claim 1, and
said indicator circuit including a constant current supply, and said power supply circuit including a current supply of higher voltage than said constant current supply.

8. In a local circuit for a selected location connectible to a remote selector means,
terminals on said unit for connection through said selector means,
a first resistor and a second resistor connected in series with each other and in parallel with said terminals,
a third resistor in series with said terminals and with said first and second resistors,
said resistors being of predetermined values of circuit indication corresponding to the condition of the circuit connected to said terminals,
other terminals connectible to a switch actuator circuit, said switch actuator circuit including
a normally non-conductive thyristor in said circuit having a current control part,
a first capacitor in the circuit in series with said thyristor,
a normally non-conductive trigger diode in series with the control part of said thyristor,
a second capacitor in said circuit connected to said trigger diode so as to render said trigger diode conductive upon a predetermined accumulated charge,
said trigger diode being capable of rendering said thyristor conductive when the diode becomes conductive, thereby to discharge said first capacitor for closing the actuator circuit.

9. The local circuit unit specified in claim 8, and
the switch actuated by said actuating circuit being a line disconnect device.

* * * * *